United States Patent
Hustad et al.

(10) Patent No.: US 9,916,973 B2
(45) Date of Patent: *Mar. 13, 2018

(54) PHOTOLITHOGRAPHIC METHODS

(71) Applicants: Rohm and Haas Electronic Materials LLC, Marlborough, MA (US); Dow Global Technologies LLC, Midland, MI (US)

(72) Inventors: Phillip D. Hustad, Natick, MA (US); Jong Keun Park, Shrewsbury, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/971,092

(22) Filed: Dec. 16, 2015

(65) Prior Publication Data

US 2016/0187782 A1 Jun. 30, 2016

Related U.S. Application Data

(60) Provisional application No. 62/099,117, filed on Dec. 31, 2014.

(51) Int. Cl.
| | |
|---|---|
| *G03F 7/16* | (2006.01) |
| *H01L 21/02* | (2006.01) |
| *H01L 21/311* | (2006.01) |
| *G03F 7/039* | (2006.01) |
| *G03F 7/32* | (2006.01) |
| *G03F 7/40* | (2006.01) |
| *H01L 21/027* | (2006.01) |

(52) U.S. Cl.
CPC ........ *H01L 21/0206* (2013.01); *G03F 7/0392* (2013.01); *G03F 7/0397* (2013.01); *G03F 7/325* (2013.01); *G03F 7/405* (2013.01); *H01L 21/0273* (2013.01); *H01L 21/31144* (2013.01)

(58) Field of Classification Search
CPC ... G03F 7/0397; G03F 7/405; H01L 21/3105; H01L 21/31058; H01L 21/31127
USPC .................................. 430/330, 314
See application file for complete search history.

(56) References Cited

U.S. PATENT DOCUMENTS

| | | | |
|---|---|---|---|
| 9,448,483 B2 * | 9/2016 | Hustad | G03F 7/325 |
| 2006/0046205 A1 * | 3/2006 | Hah | B82Y 30/00 |
| | | | 430/324 |
| 2010/0330498 A1 | 12/2010 | Bae et al. | |
| 2011/0117490 A1 | 5/2011 | Bae et al. | |
| 2014/0093825 A1 | 4/2014 | Ogihara et al. | |
| 2015/0253673 A1 | 9/2015 | Iwato et al. | |
| 2015/0338744 A1 | 11/2015 | Hatakeyama et al. | |
| 2016/0033869 A1 | 2/2016 | Hustad et al. | |
| 2016/0246171 A1 | 8/2016 | deVilliers et al. | |

FOREIGN PATENT DOCUMENTS

JP    2014178711 A    9/2014

OTHER PUBLICATIONS

Oyama, et al, "The enhanced photoresist shrink process technique toward 22nm node", Advances in Resist Materials and Processing Technology XXVII, Proc. of SPIE, 2011, 79722Q-1-79722Q-6, vol. 7972.
Search report for corresponding Taiwan Application No. 104142172 dated Sep. 29, 2016.
Weimer, et al, "Materials for and Performance of Multilayer Lithography Schemes", Proc. SPIE Advances in Resist Materials and Processing Technology XXIV, 2007, pp. 65192S, vol. 6519.

* cited by examiner

*Primary Examiner* — Daborah Chacko-Davis
(74) *Attorney, Agent, or Firm* — Jonathan D. Baskin (57) ABSTRACT

Provided are photolithographic methods. The method comprise: (a) providing a semiconductor substrate comprising an organic layer to be etched; (b) applying a layer of a photoresist composition directly on the organic layer, wherein the photoresist composition comprises: a resin comprising an acid cleavable leaving group, the cleavage of which forms an acid group and/or an alcohol group; a photoacid generator; and a solvent; (c) exposing the photoresist layer to activating radiation through a patterned photomask; (d) heating the photoresist layer, wherein acid generated by the acid generator causes cleavage of the acid cleavable leaving group, thereby forming the acid group and/or the alcohol group; (d) developing the exposed photoresist composition layer with an organic solvent developer to form a negative resist pattern comprising the acid group and/or the alcohol group; (e) applying a silicon-containing composition over the resist pattern, wherein the composition comprises a silicon-containing polymer and a solvent and is free of crosslinkers; (f) rinsing residual silicon-containing composition from the substrate, leaving a portion of the silicon-containing polymer on a surface of the resist pattern; and (g) selectively etching the organic layer. The methods find particular applicability in the manufacture of semiconductor devices for providing high resolution patterns.

10 Claims, 1 Drawing Sheet

PHOTOLITHOGRAPHIC METHODS

This application claims the benefit of priority under 35 U.S.C. § 119(e) to U.S. Provisional Application No. 62/099,117, filed Dec. 31, 2014, the entire contents of which are incorporated herein by reference.

FIELD OF THE INVENTION

The invention relates generally to the manufacture of electronic devices. More specifically, this invention relates to photolithographic methods which allow for the formation of fine patterns using negative tone development and selective etching processes.

BACKGROUND OF THE INVENTION

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

An important enabler for advanced lithographic patterning has been the introduction of antireflective coatings (ARCs). These materials absorb light at the resist/substrate interface to prevent reflection, thus reducing standing waves and thin-film interference to enable printing of patterns with vertical profiles. BARCs were originally implemented as a bilayer stack of photoresist on an organic ARC layer. Such ARCs were conventionally designed to etch faster than the overlying resist pattern to enable pattern transfer. With reductions in device geometry, however, the adoption of more complicated stacks has become necessary. For example, trilayer stacks of photoresist/silicon ARC/carbon has been used to enable pattern transfer at smaller dimensions, described, for example, in Weimer et al, Materials for and performance of multilayer lithography schemes, Proc. SPIE 6519, Advances in Resist Materials and Processing Technology XXIV, Proc. Of SPIE, Vol. 6519, 65192S (2007). In a typical process, a thin silicon ARC (Si-ARC) is initially opened with a fluorocarbon etch before switching to an oxygen-containing etch to transfer the pattern to the underlying carbon layer. This process has disadvantages including, for example, the need for numerous process steps leading to decreases in product throughput. In addition, the process is generally unstable with current SiARC formulations. In this regard, SiARCs are typically silicon oxide precursors made with sol-gel chemistry using condensation of silicon alkoxide precursors. The condensation reaction continues over time, which can result in increased molecular weight of the polymer and increased viscosity of the solution. As a result, such materials typically have a short shelf-life, on the order of a week. This leads to waste of the material if not used quickly.

There is a continuing need in the art for improved photolithographic methods which address one or more problems associated with the state of the art and which allow for the formation of fine patterns in electronic device fabrication.

SUMMARY

In accordance with one aspect of the invention, photolithographic methods are provided. The methods comprise: (a) providing a semiconductor substrate comprising an organic layer to be etched; (b) applying a layer of a photoresist composition directly on the organic layer, wherein the photoresist composition comprises: a resin comprising an acid cleavable leaving group, the cleavage of which forms an acid group and/or an alcohol group; a photoacid generator; and a solvent; (c) exposing the photoresist layer to activating radiation through a patterned photomask; (d) heating the photoresist layer, wherein acid generated by the acid generator causes cleavage of the acid cleavable leaving group, thereby forming the acid group and/or the alcohol group; (d) developing the exposed photoresist composition layer with an organic solvent developer to form a negative resist pattern comprising the acid group and/or the alcohol group; (e) applying a silicon-containing composition over the resist pattern, wherein the composition comprises a silicon-containing polymer and a solvent and is free of crosslinkers; (f) rinsing residual silicon-containing composition from the substrate, leaving a portion of the silicon-containing polymer on a surface of the resist pattern; and (g) selectively etching the organic layer. The methods find particular applicability in the manufacture of semiconductor devices for providing high resolution patterns.

The terminology used herein is for the purpose of describing particular embodiments only and is not intended to be limiting of the invention. As used herein, the singular forms "a", "an" and "the" are intended to include both singular and plural forms, unless the context clearly indicates otherwise. Reference to specific glass transition temperatures ($T_g$) are as measured by differential scanning calorimetry.

BRIEF DESCRIPTION OF THE DRAWINGS

The present invention will be described with reference to the following drawings, in which like reference numerals denote like features, and in which.

DETAILED DESCRIPTION

Resist Pattern Treating Compositions

Resist pattern treating compositions useful in the invention include a silicon-containing polymer and a solvent, and can include one or more additional, optional components. The compositions, when coated over an NTD-formed photoresist pattern and organic layer, for example, an organic BARC layer, can provide high etch resistance to an organic layer etchant such as oxygen plasma, thereby allowing for selective etching of the organic layer directly using the treated photoresist pattern as an etching mask. The resist pattern treating compositions can be coated using a spin-coating tool, thereby allowing for simplified processing and ease in integration with the photoresist patterning process. In this way, complicated patterning schemes, for example, those using trilayer stacks such as photoresist/silicon ARC/carbon, can be avoided. Compositions as described herein, when used in the methods of the invention, can further provide one or more of: uniform attachment to a resist pattern; tunable thickness on the resist pattern, thereby allowing for creation of smaller etched features through shrink process; improved resist pattern line width roughness (LWR); and improved pattern uniformity.

Suitable silicon-containing polymers for the pattern treating compositions include, for example, random copolymers and block copolymers (BCPs). The random copolymers can include two, three, four or more different units. The block copolymers can be multiblock copolymers. The multiblocks can include, for example, diblocks, triblocks, tetrablocks, or more blocks. The blocks can be part of a linear copolymer, a branched copolymer where the branches are grafted onto a backbone (these copolymers are also sometimes called "comb copolymers"), a, star copolymer, and the like. The silicon-containing polymer is capable of adhering to an NTD-formed photoresist pattern, for example, by bonding with an acid and/or alcohol group present on the resist pattern as a result of deprotection during the resist patterning process. The polymer preferably has a "sticky" component that anchors the polymer to the deprotected group of the resist pattern, and a "smoothing" component which allows for the formation of a smooth surface. The sticky and smoothing components are typically on different blocks of a block copolymer or in different units of a random copolymer. One or both of the sticky component and the smoothing components are silicon-containing.

The sticky component of the polymer preferably includes a group containing a hydrogen acceptor effective to form a bond, preferably an ionic or hydrogen bond, with a deprotected acid group and/or alcohol group at a surface of the resist pattern. The group containing the hydrogen acceptor can be, for example, a nitrogen-containing group or an oxygen-containing group. Suitable nitrogen-containing groups can form an ionic bond with an acid group at the surface of the resist pattern. Useful nitrogen-containing groups include, for example, amine groups such as primary amines, secondary amines and tertiary amines, and amide groups such as alkylamide groups. The nitrogen-containing groups can also be part of a ring, such as pyridine, indole, imidazole, triazine, pyrrolidine, azacyclopropane, azacyclobutane, piperidine, pyrrole, purine, diazetidine, dithiazine, azocane, azonane, quinoline, carbazole, acridine, indazole, benzimidazole, and the like.

Suitable oxygen-containing groups can form a hydrogen bond with a deprotected alcohol group at the surface of the resist pattern. Useful oxygen-containing groups include, for example, ether and alcohol groups. Suitable alcohols include, for example, primary hydroxyl groups such as hydroxymethyl, hydroxyethyl, and the like; secondary hydroxyl groups such as 1-hydroxyethyl, 1-hydroxypropyl, and the like; and tertiary alcohols such as 2-hydroxypropan-2-yl, 2-hydroxy-2-methylpropyl, and the like; and phenol derivatives such as 2-hydroxybenzyl, 3-hydroxybenzyl, 4-hydroxybenzyl, 2-hydroxynaphthyl, and the like. Useful ether groups include, for example, methoxy, ethoxy, 2-methoxyethoxy, and the like. Other useful oxygen-containing groups include diketone functionalities such as pentane-2,4-dione, and ketones such as ethanone, butanone, and the like.

Suitable monomer units for the sticky component include, for example, 2-(N,N-dimethylamino)ethyl methacrylate, 2-(N,N-dimethylamino)ethyl acrylate, 2-(tert-butylamino) ethyl methacrylate, 2-N-morpholinoethyl acrylate, 2-N-morpholinoethyl methacrylate, 3-dimethylaminoneopentyl acrylate, N-(t-BOC-aminopropyl) methacrylamide, N-[2-(N,N-dimethylamino)ethyl]methacrylamide, N-[3-(N,N-dimethylamino)propyl]acrylamide, N-[3-(N,N-dimethylamino)propyl]methacrylamide, 2-vinylpyridine, 4-vinylpyridine, N-(3-aminopropyl)methacrylamide, 2-aminoethyl methacrylate, 2-(dimethylamino)styrene, 4-(dimethylamino)styrene, 2-vinylpyridine, 4-vinylpyridine, and N-vinylpyrrolidone. When the material is based on polysiloxane chemistry, the sticky component typically includes an amine-functional siloxane monomer, such as n-(acetylglycyl)-3-aminopropyltrimethoxysilane, 3-(n-allylamino)propyltrimethoxysilane, allylaminotrimethylsilane, 4-aminobutyltriethoxysilane, 4-amino-3,3-dimethylbutylmethyldimethoxysilane, 4-amino-3,3-dimethylbutyltrimethoxysilane, n-(2-aminoethyl)-3-amninoisobutyldimethylmethoxysilane, n-(2-aminoethyl)-3-aminoisobutylmethyldimethoxysilane, (aminoethylaminomethyl)phenethyltrimethoxysilane, n-(2-aminoethyl)-3-aminopropylmethyldiethoxysilane, n-(2-aminoethyl)-3-aminopropylmethyldimethoxysilane, n-(2-aminoethyl)-3-aminopropyltriethoxysilane, n-(2-aminoethyl)-3-aminopropyltrimethoxysilane, n-(2-aminoethyl)-2,2,4-trimethyl-1-aza-2-silacyclopentane, n-(6-aminohexyl)aminomethyltriethoxysilane, n-(6-aminohexyl) aminomethyltrimethoxysilane, n-(2-aminoethyl)-11-aminoundecyltrimethoxysilane, 3-(m-aminophenoxy) propyltrimethoxysilane, m-aminophenyltrimethoxysilane, p-aminophenyltrimethoxysilane, n-3-[(amino(polypropylenoxy)]aminopropyltrimethoxysilane, 3-aminopropylmethyldiethoxysilane, 3-aminopropyltriethoxysilane, 3-aminopropyltrimethoxysilane, 11-aminoundecyltriethoxysilane, n-(2-n-benzylaminoethyl)-3-aminopropyltrimethoxysilane, n-butylaminopropyltrimethoxysilane, t-butylaminopropyltrimethoxysilane, (n-cyclohexylaminomethyl)triethoxysilane, (n-cyclohexylaminomethyl)trimethoxysilane, (n,n-diethyl-3-aminopropyl)trimethoxysilane, n,n-dimethyl-3-aminopropylmethyldimethoxysilane, (n,n-dimethyl-3-aminopropyl)trimethoxysilane, (3-(n-ethylamino)isobutyl) trimethoxysilane, n-methylaminopropylmethyldimethoxysilane, n-methylaminopropyltrimethoxysilane, (phenylaminomethyl)methyldimethoxysilane, n-phenylaminopropyltrimethoxysilane, or the like.

The surface component-containing monomer unit is typically present in the polymer in an amount of from 0.001 to 100 mole %, from 0.01 to 50 mole %, from 0.1 to 20 mole %, or from 0.1 to 10 mole %, based on the polymer.

The smoothing component preferably has a $T_g$ such that it can flow during post-exposure bake to form a smooth surface by minimizing its surface area with air. The $T_g$ is preferably lower than a reflow temperature of the underlying resist pattern. With this property, the pattern treating compositions can provide improved line edge and circularity roughness, resulting in smoother lines and more circular holes. While the desired $T_g$ will depend on the underlying photoresist pattern, the smoothing component typically has a $T_g$ of from −140 to 200° C., for example, from −125 to 170° C. Suitable materials for the smoothing component of the polymer include, for example, poly(t-butylmethacrylate), poly(methylmethacrylate), poly(ethylmethacrylate), poly(propylmethacrylate), polystyrene, polyethylene, polydimethylsiloxane, and the like.

Suitable materials for the smoothing component of the polymer include vinyl aromatic monomers, acrylate monomers, (alkyl)acrylate monomers, polysiloxanes, poly(dimethylsilabutane)s, or combinations thereof. Suitable vinyl aromatic monomers for the smoothing component include styrene, o-methylstyrene, p-methylstyrene, m-methylstyrene, α-methylstyrene, ethyl styrene, α-methyl-p-methylstyrene, 2,4-dimethylstyrene, monochlorostyrene, 4-tert-butylstyrene, or the like, or a combination comprising at least one of the foregoing alkylstyrene monomers. The vinyl aromatic monomers can also include pendent silicon atoms, for example, as represented by Formula 1:

(1)

wherein $R_1$ is $SiR_2$ where $R_2$ is a $C_1$-$C_{10}$ alkyl, $OSiMe_2SiMe_3$, $O(SiMe_2)_2SiMe_3$, $SiMe_2SiMe_3$, $(SiMe_2)_2SiMe_3$, or the like. Exemplary styrene monomers that include pendent silicon atoms are shown in Formulas 2-4:

(2)
(3)
(4)

Suitable acrylate monomers for the smoothing component can have a structure derived from a monomer, for example, represented by Formula 5:

(5)

wherein $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group. Examples of the (alkyl)acrylates are methacrylate, ethacrylate, propyl acrylate, methyl methacrylate, methyl ethylacrylate, methyl propylacrylate, ethyl ethylacrylate, methyl arylacrylate, or the like, or a combination comprising at least one of the foregoing acrylates. The term "(meth)acrylate" implies that either an acrylate or methacrylate is contemplated unless otherwise specified. Exemplary examples of acrylate monomers for the smoothing component are poly(t-butylmethacrylate), poly(methylmethacrylate), poly(ethylmethacrylate), poly(propylmethacrylate).

The acrylate monomers can also include pendent silicon atoms, for example, as represented by Formula 6:

(6)

wherein $R_2$ contains silicon, for example, $R_2$=$SiR_3$ wherein $R_3$ is a $C_1$-$C_{10}$ alkyl, $OSiMe_2SiMe_3$, $O(SiMe_2)_2SiMe_3$, $SiMe_2SiMe_3$, $(SiMe_2)_2SiMe_3$, $CH_2SiMe_3$, $CH(SiMe_3)_2$, and the like. Exemplary acrylate monomers including pendent silicon atoms are shown in Formulas 7-14:

(7)

(8)

(9)

(10)

(11)

(12)

(13)

(14)

The smoothing component can also comprise polysiloxanes derived from a siloxane monomer and having a repeating unit with the structure of formula 15

(15)

wherein each R is independently a $C_1$-$C_{10}$ alkyl, a $C_3$-$C_{10}$ cycloalkyl, a $C_6$-$C_{14}$ aryl, a $C_7$-$C_{13}$ alkylaryl or a $C_7$-$C_{13}$ arylalkyl. Combinations of the foregoing R groups can be present in the same monomer. Exemplary siloxanes include dimethylsiloxane, diethylsiloxane, diphenylsiloxanes, and combinations thereof.

The smoothing component, when used in the polymer, can be present in the polymer in an amount, for example, of from 50 to 99.999 mole %, from 50 to 99.99 mole %, from 80 to 99.9 mole %, or from 90 to 99.9 mole %, based on the polymer.

By selection of a suitable polymer, the amount of growth of the polymer on the resist pattern sidewall can be accurately controlled. Larger growth may be desired, for example, if it is desired to create smaller etched features in a shrink process. This thickness can be controlled, for example, by selection of a suitable molecular weight, with higher molecular weights resulting in greater thicknesses and vice-versa. The chemical composition of the polymer can also influence the amount of growth. For example, polymers with a longer unperturbed end-to-end distance or characteristic ratio provide a larger thickness for a given molecular weight. When coated over the resist pattern, for example, a contact hole, trench or line and space patterns, a consistent shrink value can be obtained regardless of feature size or density. That is, the compositions allow for a shrink pattern with minimal or no proximity bias.

The silicon-containing polymer should have good solubility in an organic solvent used in the resist pattern treating composition and an organic solvent used to rinse and completely remove excess polymer (i.e., polymer not attached to the resist pattern) from the substrate. The content of the polymer in the pattern treating compositions will depend, for example, on the desired coating thickness of the composition. The silicon-containing polymer is typically present in the composition in an amount of from 80 to 100 wt %, more typically from 90 to 100 wt %, for example 100 wt % based on total solids of the composition. The weight average molecular weight of the silicon-containing polymer is typically less than 400,000, preferably from 5000 to 200,000, more preferably from 1000 to 125,000 g/mol.

The silicon-containing polymer preferably has good etch resistance to facilitate pattern transfer. The polymer's etch resistance to oxygen plasma increases with increasing silicon content. Polymers high in silicon generally have high resistance to oxygen plasma reactive ion etching. Thus, silicon content is generally used as a means to predict etch properties. When high etch resistance is desired, the silicon content for the polymer is typically greater than 10 wt %, preferably greater than 15 wt %, and more preferably greater than 20 wt %, greater than 25 wt % or greater than 30 wt %, based on the polymer.

Polymers useful in the resist pattern treating compositions include block and random copolymers having a plurality of distinct repeat units, for example, two, three or four distinct repeat units. Suitable copolymers useful in the compositions include, for example: poly[(trimethylsilylmethyl methacrylate)-ran-(N,N-dimethylaminoethyl methacrylate)]; poly[(4-trimethylsilylstyrene)-ran-(N,N-dimethylaminoethyl methacrylate)]; poly[(trimethylsilylmethyl methacrylate)-ran-(2-vinylpyridine)]; aminopropylmethylsiloxane-dimethylsiloxane copolymer; aminoethylaminopropylmethylsiloxane-dimethylsiloxane copolymer; aminoethylaminoisobutylmethylsiloxane-dimethylsiloxane copolymer; poly(4-trimethylsilylstyrene)-block-poly(2-vinylpyridine); poly(trimethylsilylmethyl methacrylate)-block-poly(N,N-dimethylaminoethyl methacrylate); poly(4-trimethylsilyl styrene)-block-poly(N,N-dimethylaminoethyl methacrylate); poly(trimethylsilylmethyl methacrylate)-block-poly(2-vinylpyridine); poly(dimethylsiloxane)-block-poly(2-vinylpyridine); and poly(dimethylsiloxane)-block-poly(N,N-dimethylaminoethyl methacrylate).

The pattern treating compositions typically include a single polymer, but can optionally include one or more additional polymer as described above or another polymer. Suitable polymers for use in the compositions are commercially available and/or can readily be made by persons skilled in the art.

The pattern treating compositions further include an organic solvent or mixture of organic solvents. Suitable solvent materials to formulate and cast the compositions exhibit excellent solubility characteristics with respect to the non-solvent components of the compositions, but do not appreciably dissolve an underlying photoresist pattern. Suitable organic solvents for the compositions include, for example: alkyl esters such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; and alcohols such as straight, branched or cyclic $C_4$-$C_9$ monohydric alcohol such as 1-butanol, 2-butanol, 3-methyl-1-butanol, isobutyl alcohol, tert-butyl alcohol, 1-pentano, 2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; and mixtures containing one or more of these solvents. Of these organic solvents, alkyl propionates, alkyl butyrates and ketones, preferably branched ketones, are preferred and, more preferably, $C_8$-$C_9$ alkyl propionates, $C_8$-$C_9$ alkyl propionates, $C_8$-$C_9$ ketones, and mixtures containing one or more of these solvents. Suitable mixed solvents include, for example, mixtures of an alkyl ketone and an alkyl propionate such as the alkyl ketones and alkyl propionates described above. The solvent component of the pattern treating compositions is typically present in an amount of from 90 to 99 wt % based on the composition.

The pattern treating compositions may include one or more optional additives including, for example, surfactants and antioxidants. Such optional additives if used are each typically present in the compositions in minor amounts such as from 0.01 to 10 wt % based on total solids of the composition.

Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable nonionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McGutcheon's Emnulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL and DYNOL. Additional suitable surfactants include other polymeric compounds such as the tri-block EO-PO-EO co-polymers PLURONIC 25R2, L121, L123, L31, L81, L101 and P123 (BASF, Inc.).

An antioxidant can be added to prevent or minimize oxidation of organic materials in the pattern treating compositions. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butylhydroxyanisole, 2-(1-methylcyclohexyl)-4,6-dimethylphenol, 2,4-dimethyl-6-tert-butylphenol, 2-methyl-4,6-di-nonylphenol, 2,6-di-tert-butyl-α-dimethylamino-p-cresol, 6-(4-hydroxy-3,5-di-tert-butylanilino)2,4-bis-octyl-thio-1,3,5-triazine, n-octadecyl-3-(4'-hydroxy-3',5'-di-tert-butylphenyl)propionate, octylated phenol, aralkyl-substituted phenols, alkylated p-cresol and hindered phenol; bis-, tris- and poly-phenols such as 4,4'-dihydroxydiphenyl, methylene-bis (dimethyl-4,6-phenol), 2,2'-methylene-bis-(4-methyl-6-tert-butylphenol), 2,2'-methylene-bis-(4-methyl-6-cyclohexylphenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-cross-linked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methyl cyclohexyl)-5,5'-dimnethyldiphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane. Suitable antioxidants are commercially available, for example, Irganox™ antioxidants (Ciba Specialty Chemicals Corp.).

The pattern treating compositions are free of crosslinkers. It is believed that crosslinkers can adversely impact proximity and size bias characteristics, wherein coating thickness on isolated features will be larger than on more densely packed features due to the higher concentration of acid in the isolated resist patterns. The compositions are preferably free of acids, acid generator compounds, for example, thermal acid generator compounds and photoacid generator compounds, as such compounds may limit the extent of coating of the polymer on the resist pattern due to competition for the resist patterns acid and/or alcohol groups.

The pattern treating compositions can be prepared following known procedures. For example, the compositions can be prepared by dissolving the polymer and other optional solid components of the composition in the solvent components. The desired total solids content of the compositions will depend on factors such as the particular polymer(s) in the composition and desired final layer thickness. Preferably, the solids content of the compositions is from 1 to 10 wt %, more preferably from 1 to 5 wt %, based on the total weight of the composition.

NTD Photoresist Compositions

Photoresist compositions useful in the invention include chemically-amplified photoresist compositions comprising a matrix resin that is acid-sensitive, meaning that as part of a layer of the photoresist composition, the resin and composition layer undergo a change in solubility in an organic developer as a result of reaction with acid generated by a photoacid generator following softbake, exposure to activating radiation and post exposure bake. The change in solubility is brought about when acid-cleavable leaving groups such as photoacid-labile ester or acetal groups in the matrix polymer undergo a photoacid-promoted deprotection reaction on exposure to activating radiation and heat treatment to produce an acid or an alcohol group. Suitable photoresist compositions useful for the invention are commercially available.

For imaging at sub-200 nm wavelengths such as 193 nm, the matrix polymer is typically substantially free (e.g., less than 15 mole %) or completely free of phenyl, benzyl or other aromatic groups where such groups are highly absorbing of the radiation. Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer.

Suitable matrix polymers further include polymers that contain (alkyl)acrylate units, preferably including acid-labile (alkyl)acrylate units, such as t-butyl acrylate, t-butyl methacrylate, methyladamantyl acrylate, methyl adamantyl methacrylate, ethylfenchyl acrylate, ethylfenchyl methacrylate, and the like, and other non-cyclic alkyl and alicyclic (alkyl)acrylates. Other suitable matrix polymers include, for example, those which contain polymerized units of a non-aromatic cyclic olefin (endocyclic double bond) such as an optionally substituted norbornene.

Still other suitable matrix polymers include polymers that contain polymerized anhydride units, particularly polymerized maleic anhydride and/or itaconic anhydride units, such as disclosed in European Published Application EP01008913A1 and U.S. Pat. No. 6,048,662.

Also suitable as the matrix polymer is a resin that contains repeat units that contain a hetero atom, particularly oxygen and/or sulfur (but other than an anhydride, i.e., the unit does not contain a keto ring atom). The heteroalicyclic unit can be fused to the polymer backbone, and can comprise a, fused carbon alicyclic unit such as provided by polymerization of a norbornene group and/or an anhydride unit such as provided by polymerization of a maleic anhydride or itaconic anhydride. Such polymers are disclosed in PCT/US01/14914 and U.S. Pat. No. 6,306,554. Other suitable heteroatom group containing matrix polymers include polymers that contain polymerized carbocyclic aryl units substituted with one or more hetero-atom (e.g., oxygen or sulfur) containing groups, for example, hydroxy naphthyl groups, such as disclosed in U.S. Pat. No. 7,244,542.

Blends of two or more of the above-described matrix polymers can suitably be used in the photoresist compositions.

Suitable matrix polymers for use in the photoresist compositions are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000.

The photoresist composition further comprises a, photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can also include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases include, for example: linear and cyclic amides and derivatives thereof such as N,N-bis (2-hydroxyethyl)pivalamide, N,N-Diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl) amine, 2,2',2'',2'''-(ethane-1,2-diylbis (azanetriyl))tetraethanol, and 2-(dibutylamino)ethanol, 2,2', 2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl) morpholine. The added base is typically used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Suitable NTD photoresists are known in the art and include, for example, those described in US Patent Publications US20130115559A1, US20110294069A1, US20120064456A1, US20120288794A1, US20120171617A1, US20120219902A1 and U.S. Pat. No. 7,998,655B2.

Photolithographic Methods

Processes in accordance with the invention will now be described with reference to FIG. 1A-F, which illustrates an exemplary process flow for forming a photolithographic pattern by negative tone development.

Figure 1A:
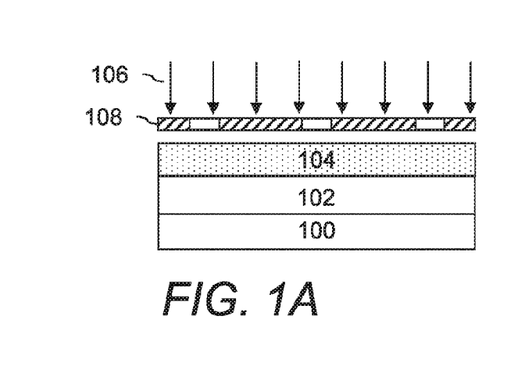
FIG. 1A-F is a process flow for a photolithographic process in accordance with the invention.

FIG. 1A depicts in cross-section a substrate 100 which can include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers to be etched on a surface thereof. The layers may include, for example, one or more conductive layer such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched will vary depending on the materials and particular devices being formed.

An organic layer 102 is provided over the substrate 100. The organic layer is preferably substantially free (e.g., less than 5 wt % based on the layer) or completely free of silicon. The organic layer can, for example, be an organic bottom antireflective coating (BARC) layer directly on which a photoresist layer 104 is to be coated. An organic BARC layer can be used when the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable organic antireflective materials and methods of formation are known in the art. Organic antireflective materials are commercially available, for example, those sold under the AR™ trademark by Rohm and Haas Electronic Materials LLC (Marlborough, Mass. USA), such as AR™40A and AR™124 antireflectant materials. A typical thickness for the organic layer 102 is from 500 to 2000 Å.

A photoresist layer 104 is disposed on the substrate over the organic layer 102. The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 104 is from 500 to 3000 Å.

The photoresist layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

The photoresist layer 104 is next exposed to activating radiation 106 through a patterned photomask 108 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to remain and be removed, respectively, in a subsequent development step. The exposure wavelength is typically sub-400 nm, sub-300 nm or sub-200 nm, with 248 nm, 193 nm and EUV wavelengths (e.g., 13.5 nm) being typical. The methods find use in immersion or dry (non-immersion) lithography techniques. The exposure energy is typically from about 10 to 80 mJ/cm$^2$, dependent upon the exposure tool and the components of the photoresist composition.

Following exposure of the photoresist layer 104, a post-exposure bake (PEB) is performed. Acid generated by the acid generator causes cleavage of the acid cleavable leaving groups to form acid groups, typically carboxylic acid groups, and/or alcohol groups. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds.

Figure 1B:
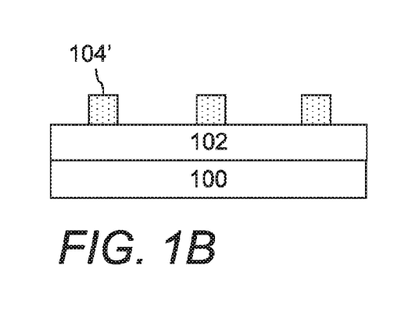

The exposed photoresist layer is next developed to remove unexposed regions, leaving exposed regions forming a negative resist pattern 104' as shown in FIG. 1B. Resist pattern 104' includes de-blocked carboxylic acid groups and/or alcohol groups. The negative tone developer is an organic solvent developer, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene and xylene. In addition, mixtures of these solvents, or one or more of the listed solvents mixed with a solvent other than those described above or mixed with water can be used. Other suitable solvents include those used in the photoresist composition. The developer is preferably 2-heptanone or a butyl acetate such as n-butyl acetate. The organic solvent(s) are typically present in the developer in a combined amount of from 90 wt % to 100 wt %, more typically greater than 95 wt %, greater than 98 wt %, greater than 99 wt % or 100 wt %, based on the total weight of the developer.

The developer material may include optional additives, for example, surfactants such as described above with respect to the photoresist. Such optional additives typically will be present in minor concentrations, for example, in amounts of from about 0.01 to 5 wt % based on the total weight of the developer.

The developer can be applied to the substrate by known techniques, for example, by spin-coating or puddle-coating. The development time is for a period effective to remove the unexposed regions of the photoresist, with a, time of from 5 to 30 seconds being typical. Development is typically conducted at room temperature.

Following development, the resist pattern 104' can optionally be heat treated in a hardbake process to further remove solvent from the resist pattern. The optional hardbake is typically conducted with a hot plate or oven, and is typically conducted at a temperature of about 90° C. or higher, for example, from about 100 to 150° C., and a time of from about 30 to 120 seconds.

Figure 1C:
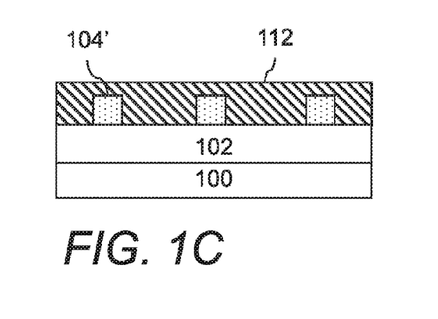

With reference to FIG. 1C, a pattern treatment composition as described herein is coated over the resist pattern 104' to form a pattern treatment composition layer 112. The composition should be applied so as to cover the resist pattern entirely.

The pattern treatment composition layer 112 is typically next softbaked to remove solvent from the composition and to cause the silicon-containing polymer to diffuse and induce bonding between the sticky portion of the polymer and the deprotected acid and/or alcohol group of the photoresist pattern. A typical softbake for the composition is conducted at a temperature of from about 90 to 150° C., and a time of from about 30 to 120 seconds.

Figure 1D:
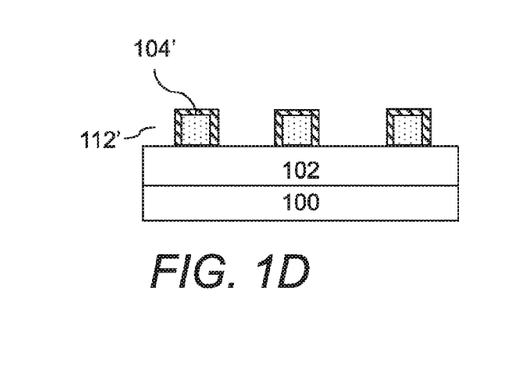

Residual pattern treatment composition including silicon-containing polymer that is not bonded to the resist pattern is next removed from the substrate by rinsing, leaving behind a layer 112' of the polymer bound to the resist pattern as shown in FIG. 1D. Suitable rinsing solutions include organic solvent developers in which the polymer is soluble. Suitable materials include, for example, developers described herein with respect to the NTD developers. Of these, n-butyl acetate and 2-heptanone are typical. The resulting image typically has an improved (i.e., reduced) surface roughness as compared with that of the resist pattern following development of the photoresist layer.

Optionally, a post-rinse bake can be conducted at a temperature above the $T_g$ of the silicon-containing polymer but below the $T_g$ of the resist pattern. This bake can provide beneficial results, for example, in the form of improved pattern roughness or circularity due to the thermodynamic drive of the polymer to minimize its interfacial area with air.

Figure 1E:
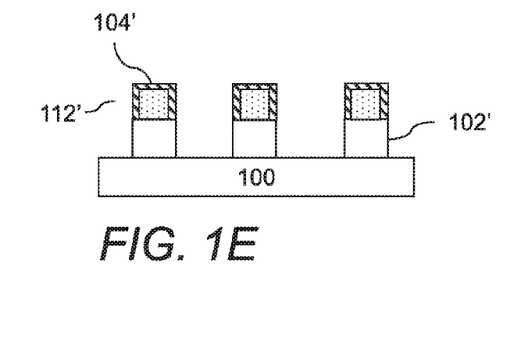
Figure 1F:
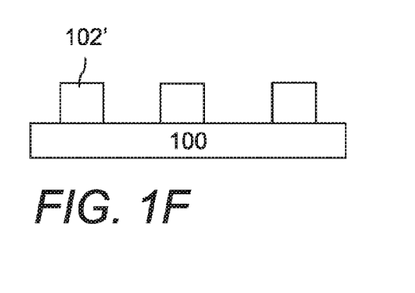

The organic layer 102 can next be selectively etched using the resist pattern 104' and bonded silicon-containing polymer 112' as an etch mask to expose the underlying substrate 100 as shown in FIG. 1E. Suitable etching techniques and chemistries for etching layer 102 are known in the art, with dry-etching processes such as reactive ion etching being typical. Organic layer 102 can be removed, for example, by oxygen plasma etching. The resist pattern 104' and silicon-containing polymer 112' are next removed from the substrate using known techniques, for example, an oxygen plasma ashing.

The following non-limiting examples are illustrative of the invention.

EXAMPLES

Photoresist Composition Preparation 1.663 g of Matrix Polymer A [$M_w$=13,300, polydispersity index (PDI)=1.49] was dissolved in 29.023 g of PGMEA, 20.316 g of methyl-2-hydroxyisobutyrate and 8.707 g of 2-heptanone. To this mixture was added 0.136 g of PAG A, 0.094 g of PAG B, 0.019 g of tert-butyl (1,3-dihydroxy-2-(hydroxymethyl)propan-2-yl)carbamate quencher and 0.039 g of Polymer Additive A. The resulting mixture was rolled on a roller for six hours and then filtered through a Teflon filter having a 0.2 micron pore size to provide Photoresist Composition PR-A.

Matrix Polymer A

PAG A

PAG B

Polymer Additive A

Resist Pattern Treating (RPT) Composition Preparation

AMS-2202, AMS-152 and AMS-1203 amine-containing polydimethylsiloxane materials (Gelest, Inc., Morrisville, Pa. USA) having the structures shown below and properties shown in Table 1 were used to prepare resist pattern treating compositions.

AMS-2202

AMS-152 and AMS-1203

TABLE 1

| Polymer | Viscosity (cP) | $M_w$ | Aminomethylsiloxane Content (Mole %) |
|---|---|---|---|
| AMS-2202 | 300-500 | NA* | 18-24 |
| AMS-152 | 100-300 | 7000-9000 | 4-5 |
| AMS-1203 | 900-1100 | 20,000 | 20-25 |

Information based on Gelest, Inc. data sheets.
*Data not provided.

Resist pattern treatment compositions (RPT) were prepared by dissolving polymers in organic solvents using the components and amounts set forth in Table 2, and filtering the composition with a 0.2 micron Teflon filter.

TABLE 2

| Example | RPT Composition | Polymer | Polymer Content | Solvent |
|---|---|---|---|---|
| 1 | RPT-1 | AMS-2202 (0.4 g) | 2 wt % | Amyl acetate (19.6 g) |
| 2 | RPT-2 | AMS-152 (0.6 g) | 3 wt % | Heptane (19.4 g) |
| 3 | RPT-3 | AMS-1203 (0.6 g) | 3 wt % | Heptane (19.4 g) |

NTD Immersion Lithography 300 mm silicon wafers were spin-coated with AR™40A antireflectant (Rohm and Haas Electronic Materials) to form a first organic BARC layer on a TEL CLEAN TRAC LITHIUS i+ coater/developer. The wafers were baked for 60 seconds at 205° C., yielding a, first BARC film with a thickness of 80 nm. A second organic BARC layer was coated over the first BARC layer using AR™ 104 antireflectant (Rohm and Haas Electronic Materials), and was baked at 175° C. for 60 seconds to generate a 40 nm top BARC layer. Photoresist Composition PR-A was spin-coated on the dual BARC-coated wafers and soft-baked at 90° C. for 60 seconds on a TEL CLEAN TRACK LITHIUS i+ coater/developer to provide a resist layer with a thickness of ~80 mm. One set of wafers was exposed through a mask having contact hole patterns and another set of wafers through a mask having line and space patterns on an ASML TWINSCAN XT: 1900i immersion scanner using CQUAD illumination condition with 1.35 NA, 0.85 outer sigma and 0.72 inner sigma. The exposed wafers were post-exposure baked at 100° C. for 60 seconds and then developed using OSD™ 1000 (Rohm and Haas Electronic Materials) developer for 25 seconds on a TEL CLEAN TRACK™ LITHIUS™ i+ coater/developer to give negative tone patterned wafers having contact hole or line and space patterns.

Resist Pattern Treating (RPT) Composition Processing and Evaluation

The RPT compositions were coated on the patterned wafers by spin-coating. The coated wafers were baked on a hotplate at 90° C. for 60 seconds. Residual ungrafted RPT material was removed by rinsing with a puddle of organic solvent and spin-drying, followed by an additional bake to remove residual solvent. The process conditions are summarized in Table 3.

TABLE 3

| Example | RPT Composition | Spin speed (rpm) | Soft Bake Temp./Time | Rinse Solvent | Post Rinse Bake Temp./Time |
|---|---|---|---|---|---|
| 4 | RPT-1 | 800 | 90° C./60 sec | 2-heptanone | 90° C./60 sec |
| 5 | RPT-2 | 1000 | 90° C./60 sec | Heptane | 90° C./60 sec |
| 6 | RPT-3 | 1000 | 90° C./60 sec | Heptane | 90° C./60 sec |

Top-down scanning electron microscopic (SEM) images were recorded with a Hitachi CG4000 SEM operating at 0.2 to 2 kV accelerating voltage and 250K magnification. Cross-sectional SEM images were recorded with a Hitachi S-4800 FE-SEM operating at 15 kV accelerating voltage and 250K magnification. Critical dimension (CD) was determined based on the SEM images for wafers before and after resist pattern treatment. Measurements included contact hole diameter or linewidth for line and space patterns. CD uniformity (CDU) was determined based on CD standard deviation of 180 contact holes. The results are summarized in Table 4.

TABLE 4

| Pattern | Example | RPT Composition | RPT Polymer | CD (nm) | CDU (nm) | ΔCD (nm) |
|---|---|---|---|---|---|---|
| Contact Hole | — | — | — | 58.7 | 2.4 | — |
|  | 7 | RPT-1 | AMS-2202 | 52.2 | 1.5 | 6.5 |
| Line and Space | — | — | None | 41.9 | — | — |
|  | 8 | RPT-2 | AMS-152 | 50.0 | — | 8.1 |
|  | 9 | RPT-3 | AMS-1203 | 48.9 | — | 7.0 |

For both contact hole and line and space patterns, resist pattern treatment resulted in growth to the resist pattern dimension in the form of reduced contact hole diameter and increased linewidth. In addition, contact hole circularity based on visual observation and CD uniformity was improved.

BARC Etching and Evaluation

Example 10

Contact Hole Etching

Contact hole-patterned wafers with and without pattern-treatment with RPT-1 were $O_2$ plasma-etched (25 sccm, 100 W, 6 mT) for 30 seconds and 60 seconds using a Plasma-Therm LLC 790+ RIE tool. Cross-sectional SEM images for pre-etched and post-etched wafers were recorded as described above. Based on visual observation of the SEM images, pattern treatment composition RPT-1 imparted very good etch resistance to the resist pattern, allowing the pattern to be transferred directly into the thick organic BARC layers with good selectivity. Conversely, the resist patterns without pattern treatment exhibited significant resist pattern erosion, resulting in poor pattern transfer to the BARC layers with low selectivity.

Example 11

Line and Space Etching

Line and space-patterned wafers with and without pattern-treatment with RPT-2 or RPT-3 were $O_2$ plasma-etched (25 sccm, 100 W, 6 mT) for 40 seconds using a Plasma-Therm LLC 790-+ RE tool. SEM images were recorded as described above, and CDs determined for RPT-2 based on the SEM images for pre- and post-etched wafers. The CD measurement results are summarized in Table 5.

TABLE 5

| | No Pattern Treatment | | | With Pattern Treatment | | |
|---|---|---|---|---|---|---|
| RPT Comp. | CD Before $O_2$ Etch (nm) | CD After $O_2$ Etch (nm) | ΔCD (nm) | CD Before $O_2$ Etch (nm) | CD After $O_2$ Etch (nm) | ΔCD (nm) |
| RPT-2 | 41.9 | 21.0 | 20.9 | 50.0 | 40.0 | 10.0 |

Pattern treatment composition RPT-2, based on the CD measurements and visual observation of SEM images of the pre- and post-etched pattern-treated wafers, and composition RPT-3, based on visual observation of the SEM images, imparted very good etch resistance to the resist pattern, allowing the pattern to be transferred directly into the thick organic BARC layers with good selectivity. Conversely, the resist patterns without pattern treatment exhibited significant resist pattern erosion, resulting in poor pattern transfer to the BARC layers with low selectivity.

What is claimed is:
1. A photolithographic method, comprising:
(a) providing a semiconductor substrate comprising an organic layer to be etched;
(b) applying a layer of a photoresist composition directly on the organic layer, wherein the photoresist composition comprises: a resin comprising an acid cleavable leaving group, the cleavage of which forms an acid group and/or an alcohol group; a photoacid generator; and a solvent;

(c) exposing the photoresist layer to activating radiation through a patterned photomask;
(d) heating the photoresist layer, wherein acid generated by the acid generator causes cleavage of the acid cleavable leaving group, thereby forming the acid group and/or the alcohol group;
(d) developing the exposed photoresist composition layer with an organic solvent developer to form a negative resist pattern comprising the acid group and/or the alcohol group;
(e) applying a silicon-containing composition over the resist pattern, wherein the composition comprises a silicon-containing polymer and an organic solvent and is free of crosslinkers;
(f) rinsing residual silicon-containing composition from the substrate, leaving a portion of the silicon-containing polymer bonded to a surface of the resist pattern; and
(g) selectively etching the organic layer using the resist pattern and bonded silicon-containing polymer as an etch mask.

2. The photolithographic method of claim 1, wherein the organic layer is a bottom antireflective coating layer.

3. The photolithographic method of claim 1, wherein the silicon-containing polymer comprises a unit formed from a vinyl aromatic monomer comprising a pendent silicon atom.

4. The photolithographic method of claim 1, wherein the silicon-containing polymer comprises a unit formed from an (alkyl)acrylate monomer comprising a pendent silicon atom.

5. The photolithographic method of claim 1, wherein the silicon-containing polymer comprises a polysiloxane.

6. The photolithographic method of claim 1, wherein the silicon-containing polymer comprises a group containing a hydrogen acceptor effective to form a bond with the acid group and/or the alcohol group at a surface of the resist pattern.

7. The photolithographic method of claim 6, wherein the group containing the hydrogen acceptor group is a nitrogen-containing group.

8. The photolithographic method of claim 1, wherein the silicon-containing polymer has a silicon content greater than 15 wt % based on the polymer.

9. The photolithographic method of claim 1, wherein the polymer comprises a block polymer comprising a first block and a second block.

10. The photolithographic method of claim 9, wherein the second block has a $T_g$ that is lower than a reflow temperature of the resist pattern.

\* \* \* \* \*